United States Patent
Lee et al.

(10) Patent No.: US 6,635,965 B1
(45) Date of Patent: Oct. 21, 2003

(54) METHOD FOR PRODUCING ULTRA-THIN TUNGSTEN LAYERS WITH IMPROVED STEP COVERAGE

(75) Inventors: Sang-Hyeob Lee, San Jose, CA (US); Joshua Collins, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/975,074

(22) Filed: Oct. 9, 2001

Related U.S. Application Data
(60) Provisional application No. 60/292,917, filed on May 22, 2001.

(51) Int. Cl.[7] .............................................. H01L 23/52
(52) U.S. Cl. .................. 257/758; 257/763; 257/764; 257/754; 257/768; 257/762; 438/628; 438/654; 438/656
(58) Field of Search ................................ 257/762, 768, 257/769, 758, 412, 763, 764, 754; 438/656, 674, 677, 253, 255, 255.1, 255.7, 680, 685, 648, 597, 582, 654, 628

(56) References Cited

U.S. PATENT DOCUMENTS

| | | | | |
|---|---|---|---|---|
| 4,804,560 A | * | 2/1989 | Shioya et al. ................ | 427/125 |
| 5,028,565 A | * | 7/1991 | Chang et al. ................ | 437/192 |
| 5,250,329 A | * | 10/1993 | Miracky et al. ............. | 427/556 |
| 5,326,723 A | * | 7/1994 | Petro et al. ................. | 437/192 |
| 5,391,394 A | * | 2/1995 | Hansen ....................... | 427/124 |
| 5,661,080 A | * | 8/1997 | Hwang et al. ............... | 438/654 |
| 5,726,096 A | * | 3/1998 | Jung .......................... | 438/592 |
| 5,795,824 A | * | 8/1998 | Hancock ..................... | 438/656 |
| 5,804,249 A | * | 9/1998 | Sukharev et al. ............. | 427/99 |
| 5,817,576 A | * | 10/1998 | Tseng et al. ................. | 438/680 |
| 5,956,609 A | * | 9/1999 | Lee et al. .................... | 438/627 |
| 6,066,366 A | * | 5/2000 | Berenbaum et al. ......... | 427/250 |
| 6,143,082 A | | 11/2000 | McInerney et al. | |
| 6,245,654 B1 | * | 6/2001 | Shih et al. ................... | 438/597 |
| 6,265,312 B1 | * | 7/2001 | Sidhwa et al. .............. | 438/685 |
| 6,294,468 B1 | * | 9/2001 | Gould-Choquette et al. ..... | 438/680 |
| 6,297,152 B1 | * | 10/2001 | Itoh et al. .................... | 438/649 |
| 6,309,966 B1 | * | 10/2001 | Govindarajan et al. ...... | 438/656 |

OTHER PUBLICATIONS

George et al., "Surface Chemistry for atomic Layer Growth", J. Phys. Chem, 1996, vol. 100, No., 31, pp. 13121–13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296–302.

Klaus et al., "Atomically controlled growth of Tungsten and Tungsten nitride using sequential surface reactions", Applied Surface Science, 162–163 (2000) 479–491.

Klaus et al., "Atomic layer deposition of tungsten using sequential surface chemistry with a sacrificial stripping reaction", Thin Solid Films 360 (2000) 145–153.

* cited by examiner

*Primary Examiner*—Nathan J. Flynn
*Assistant Examiner*—Fazli Erdem
(74) *Attorney, Agent, or Firm*—Beyer Weaver & Thomas, LLP

(57) ABSTRACT

A tungsten nucleation film is formed on a surface of a semiconductor substrate by alternatively providing to that surface, reducing gases and tungsten-containing gases. Each cycle of the method provides for one or more monolayers of the tungsten film. The film is conformal and has improved step coverage, even for a high aspect ratio contact hole.

39 Claims, 5 Drawing Sheets

METHOD FOR PRODUCING ULTRA-THIN TUNGSTEN LAYERS WITH IMPROVED STEP COVERAGE

CROSS-REFERENCE TO RELATED PATENT APPLICATIONS

This application claims priority from U.S. Provisional Patent Application No. 60/292,917, filed May 22, 2001, by Lee et al., and titled ULTRA THIN TUNGSTEN LAYER WITH IMPROVED STEP COVERAGE. This application is incorporated herein by reference for all purposes.

FIELD OF THE INVENTION

The present invention relates to the chemical vapor deposition of a tungsten film, and more particularly, to the nucleation of that deposition process on a semiconductor substrate.

BACKGROUND OF THE INVENTION

In Integrated Circuit (IC) manufacturing individual devices, such as the transistors, are fabricated in the silicon substrate and then they are connected together to perform the desired circuit functions. This connection process is generally called "metallization", and is performed using a number of photolithographic patterning, etching, and deposition steps.

The deposition of tungsten (W) films using chemical vapor deposition (CVD) techniques is an integral part of many semiconductor fabrication processes since it can produce low resistivity electrical connection between i) adjacent metal layers (vias) and ii) first metal layer and the devices on the silicon substrate (contact). Typically the W film is deposited through the reduction of tungsten hexafluoride ($WF_6$) by hydrogen ($H_2$) or silane ($SiH_4$). In a typical tungsten process, the wafer is heated to the process temperature in a vacuum chamber, and them soaked in $SiH_4$ gas to protect the already deposited titanium liner thin film on the substrate from possible reaction with $WF_6$. A thin layer of tungsten film, known as the seed or nucleation layer, is deposited by the reaction of $WF_6$ and $SiH_4$. Finally, the via or contact is filled with tungsten by the reaction of $WF_6$ and $H_2$ ("plugfill").

Conventionally, the $WF_6$ and reducing gas ($SiH_4$ or $H_2$) are simultaneously introduced into the reaction chamber. It is expected that in a tungsten process all vias and contacts are completely filled with tungsten material, i.e., a 100% plugfill is achieved. The tungsten plugfill process is very sensitive to the conformality of the tungsten seed or nucleation layer in the vias and contacts.

The common problems associated with many seed layer deposition techniques are poor sidewall step coverage and conformality. This means that the seed layer is much thicker in wide-open areas, such as on top of the contacts and vias as compared to the bottom and lower portion of the sidewalls of the contacts and vias. With the decrease of the design rule of semiconductor devices, the diameter of the contacts and vias get smaller while their heights do not decrease. Thus, the aspect ratio (height divided by diameter) of contacts and vias keep increasing. The increased aspect ratio exacerbates the problem with the step coverage and conformality, thus degrading the quality of the plugfill process.

In a conventional CVD process, reactive gases arrive at the substrate simultaneously with film growth resulting from continuous chemical reaction of the precursor and reactant gases on the substrate surface. Uniform and reproducible growth of the film is dependent on maintenance of the correct precursor and reactant flux at the substrate. The growth rate is proportional to the precursor flux at the substrate and to the substrate temperature.

Atomic layer deposition (ALD) is a method of sequentially depositing a plurality of atomic layers on a semiconductor substrate by sequentially injecting and removing reactants into and from a chamber. ALD is a surface controlled process and uses two-dimensional layer by layer deposition. ALD uses a chemical reaction like CVD but it is different from CVD in that reactant gases are individually injected in the form of a pulse instead of simultaneously injecting reactant gases, so they are not mixed in the chamber. For example, in a case of using gases A and B, gas A is first injected into a chamber and the molecules of gas A are chemically or physically adsorbed to the surface of a substrate, thereby forming an atomic layer of A. The gas A remaining in the chamber is purged using an inert gas such as argon gas or nitrogen gas. Thereafter, the gas B is injected and chemically or physically adsorbed, thereby forming an atomic layer of B on the atomic layer of A. Reaction between the atomic layer of A and the atomic layer of B occurs on the surface of the atomic layer of A only. For this reason, a superior step coverage can be obtained regardless of the morphology of the substrate surface. After the reaction between A and B is completed, residuals of gas B and by products of the reaction are purged from the chamber. The process is repeated for multiple layers of material to be deposited.

Thus, in contrast to the CVD process, ALD is performed in a cyclic fashion with sequential alternating pulses of the precursor, reactant and purge gases. The ALD precursor must have a self-limiting effect such that the precursor is adsorbed on the substrate in a monolayer atomic thickness. Because of the self-limiting effect, only one monolayer or a sub-monolayer is deposited per operation cycle. ALD is conventionally conducted at pressures less than 1 Torr.

Methods, which would form uniform seed layers in channel or vias and result in an improvement in the subsequent filling of the channel or vias by conductive materials, has long been sought, but has eluded those skilled in the art.

SUMMARY OF THE INVENTION

The present invention provides a method of forming a tungsten nucleation layer a surface of a semiconductor substrate. The method comprises the steps of comprising the steps of: positioning said semiconductor substrate at a deposition station within a single or multi-station deposition chamber; heating said semiconductor substrate to a temperature between approximately 250 to 475° C. at said deposition station; and performing an initiation soak step, which consists of exposure of the substrate to a gas in a gaseous or plasma state for about 2 to about 60 seconds. A reducing gas is subsequently flowed into the deposition chamber whereby about one or more, preferably two or more, and most preferably, three or more monolayers of reducing gas are deposited onto the surface of the substrate. The deposition chamber is then purged of the reducing gas and a tungsten-containing gas is flowed into the chamber, whereby the deposited reducing gas is substantially replaced by tungsten to provide the nucleation layer.

Preferably, the initiation soak gas comprises $SiH_4$, $B_2H_6$, $Si_2H_6$, $H_2$, Ar, $N_2$, or $O_2$, or a combination thereof and the soak gas is provided in a gaseous or plasma state. The plasma state can be produced using a radiofrequency or microwave energy source.

In a preferred embodiment, the reducing gas comprises $SiH_4$, $Si_2H_6$, $H_2$. $B_2H_6$, or $SiH_2Cl_2$ or a combination thereof. The reducing gas may further comprise, argon, hydrogen, nitrogen, or a combination thereof.

Preferably, the tungsten-containing gas comprises $WF_6$, $WCl_6$, or $W(CO)_6$ or a mixture thereof. The tungsten-containing gas may further comprise argon, hydrogen, nitrogen or a mixture thereof.

According to some embodiments, the method further comprises the step of purging the tungsten-containing gas from the chamber. Purging can be accomplished through the introduction of a purge gas, such as hydrogen, nitrogen, an inert gas, or a mixture thereof. Alternatively, the gases may be evacuated from the chamber using a vacuum pump.

The method of the invention can be repeated until the desired thickness of tungsten nucleation layer is obtained and/or may comprise further steps to produce a desired IC.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where the element is the same between illustrations.

Panel A of FIG. 1 illustrates the relationship between nucleation layer film thickness and number of cycles at temperatures ranging from 150 to 450° C. with dosing of 40 sccm of $SiH_4$ for 2 seconds and 600 sccm of $WF_6$ for 2 seconds. Panel B of FIG. 1 shows the relationship between growth rate and number of cycles under similar process parameters.

DETAILED DESCRIPTION OF THE INVENTION

Figure 1:
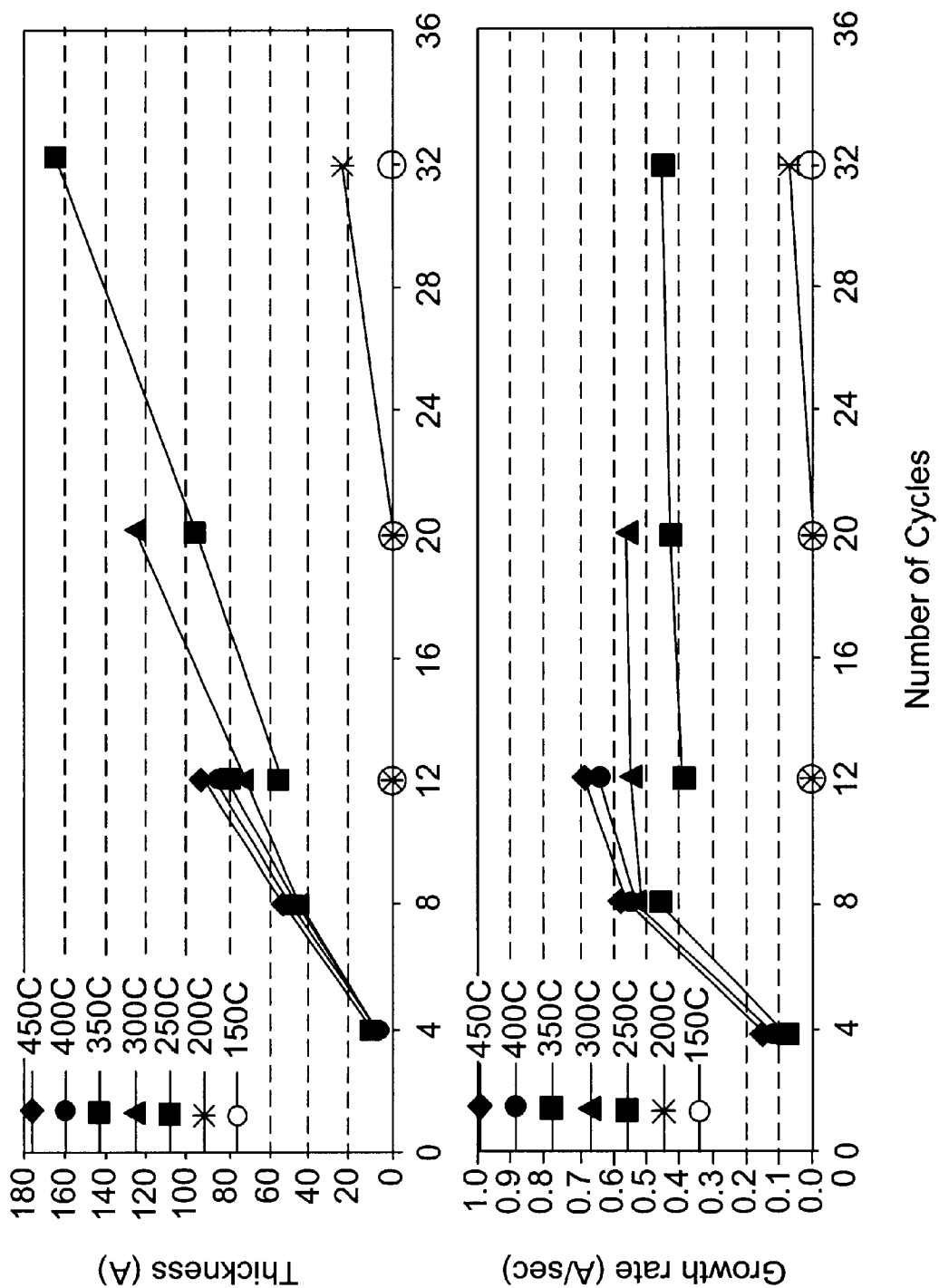

Embodiments of the present invention will be described with reference to the aforementioned figures. These figures are simplified for ease of understanding and description of embodiments of the present invention only. Modifications, adaptations or variations of specific methods and or structures shown and discussed herein may become apparent to those skilled in the art. All such modifications, adaptations or variations that rely upon the teachings of the present invention, and through which these teachings have advanced the art, are considered to be within the spirit and scope of the present invention.

Overview

The present invention provides a method to form a conformal tungsten nucleation layer by depositing a plurality of tungsten layers, each of about one or more monolayers in thickness, on a semiconductor substrate by sequentially injecting and removing reactants into and from a chamber. According to one embodiment of the invention, the method comprises the steps of:

- positioning the semiconductor substrate at a deposition station within a deposition chamber;
- heating the semiconductor substrate to a temperature between approximately 250 and 475° C., and preferably at about 350° C., at the deposition station;
- performing an initiation soak step, which comprises exposure of the substrate to a gas in a gaseous or plasma state for about 2–60 seconds to reduce or eliminate any nucleation delay;
- flowing a reducing gas into said deposition chamber whereby about one or more monolayers of the reducing gas are deposited onto said surface of said substrate;
- purging the reducing gas from the deposition chamber; and
- flowing a tungsten-containing gas into said deposition chamber, whereby said deposited reducing gas is substantially replaced by tungsten to provide said nucleation layer.

In a particularly preferred embodiment, the pressure of the deposition chamber is maintained at more than about 1 Torr. Preferably, two or more monolayers and more preferably, three or more monolayers, of the reducing gas are deposited onto the surface of the substrate. This cycle can be repeated as necessary to produce a smooth and uniform tungsten nucleation layer with the desired thickness

The Method

According to the methods of the invention, a first wafer or semiconductor substrate is placed into the deposition or reaction chamber and onto a station which has been heated to between approximately 250 and 475° C., and preferably between about 250 and 350° C. Prior to the pulsed nucleation process, the semiconductor substrate, optionally, has been exposed to a gas which promotes growth of tungsten with no delays. This step, which is called an initiation soak step, comprises exposure of the substrate to a gas such as $SiH_4$, $B_2H_6$, $Si_2H_6$, $H_2$, Ar, $N_2$, or $O_2$, or a combination thereof, in a gaseous or plasma state for about 2 to about 60 seconds. The plasma state can be produced using a radiofrequency or microwave energy source. This serves to precondition the substrate surface.

Any reducing agents such as $SiH_4$, $B_2H_6$, $Si_2H_6$, $SiH_2Cl_2$, or $H_2$, or a combination thereof, could be used for the pulsed nucleation process. Preferably, the reducing gas will comprise $SiH_4$ along with an inert carrier gas. The reducing gas is supplied at flow rates of approximately 400 to about 220, and more preferably, at about 100 to about 200, and most preferably about 200 standard cubic centimeters per second (sccm). This flow is continued for a predetermined time, typically about 5 seconds or less and preferably, about 2 seconds, and the flow of reducing gases is stopped. Generally, a gas line charge time of about 0.5 seconds is used to pressurize the gas flow lines leading to the deposition chamber prior to release of the gas into the chamber. Upon completion of the reducing gas flow time in the chamber, the gas line to the chamber is closed and then evacuated for about 0.5 seconds by utilization of a rough pump line. This is the gas line purge time. The line charge and purge times of the reducing gas can be overlapped with the chamber purge times The reaction chamber is purged prior to beginning the flow of the tungsten-containing gases. Purging preferably is accomplished by introduction of an inert gas, or nitrogen, or hydrogen, or a mixture thereof into the deposition chamber at fixed pressure and/or the vapor phase in the deposition chamber is removed through the application of a low pressure vacuum, preferably using a fast pump.

Any tungsten-containing gas, including but not limited to, $WF_6$, $WCl_6$, or $W(CO)_6$ can be used for the pulsed nucleation process. Preferably, the tungsten-containing gas comprises $WF_6$ along with an inert carrier gas. Typically, the tungsten-containing gas flow rate is between approximately 200 to about 900 sccm; preferably, between about 200 and 800 sccm, and most preferably, at about 600 sccm. It has been found that tungsten deposition occurs only on the surface where reducing gas has been absorbed. This flow is continued for a predetermined time, typically about 5 seconds or less and preferably, about 2 seconds, and the flow of reducing gases is stopped. Generally, a line charge of about 0.5 seconds is used. Upon completion of the tungsten-containing gas flow time in the chamber, the gas line to the chamber is closed and then evacuated for about 0.5 seconds by utilization of a rough pump line. This is the gas line purge time. The line charge and purge times of the tungsten-containing gas can be overlapped with the chamber purge times.

It will be understood that an inert gas such as argon or another gas such as nitrogen or hydrogen, or a combination thereof may be provided as the background gas to the deposition station simultaneously with the reducing gases or the tungsten-containing gases. In general, the flow of the background gases are continuous, i.e., it is not switched on and off as are the tungsten-containing gas and the reducing gas.

Using the methods described herein, the growth rate of tungsten per cycle is between about 8 and 12 Angstroms, and preferably between about 10 and 12 Angstroms per cycle as compared to a growth rate of less than 2.5 A that can be achieved using the conventional ALD processes.

The Product

The present invention provides a method for forming seed layers in contacts or vias with improved step coverage. More specifically, using the methods described herein, nucleation layers having a step coverage of greater than 75%; preferably, greater than 80%; and more preferably, greater than 90% can be achieved. In addition, this level of step coverage can be repeatedly and routinely produced in even high aspect ratio contacts, including, but not limited to contacts have an aspect ratio of greater than 10:1, or even 13:1 or greater.

Panel A of FIG. 1 illustrates the relationship between nucleation layer film thickness and number of cycles. Panel B of FIG. 1 shows the relationship between growth rate and number of cycles. The depositions were done at a substrate temperature of between 250 and 350° C. As shown, the nucleation layers will generally have a thickness of greater than about 50 Angstroms; and preferably, between about 80 and about 100 Angstroms.

Figure 2:
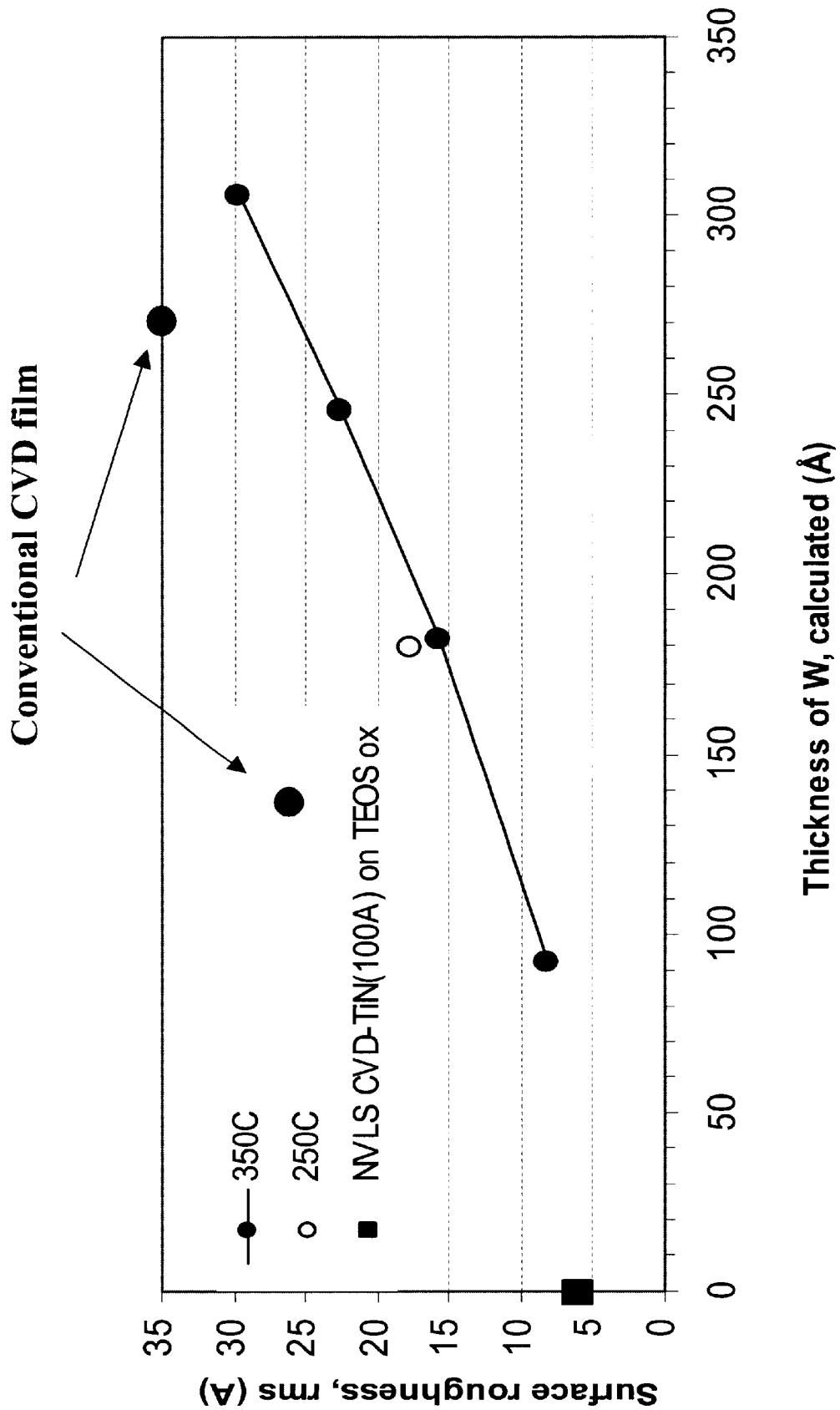
FIG. 2 shows the relationship of surface roughness, measured in Angstroms with thickness of the pulsed nucleation layer for nucleation layers produced by conventional CVD technology (large dark circles); pulsed nucleation technology at 350° C. (small dark circles); pulsed nucleation technology at 250° C. (hollow circles) and a semiconductor substrate comprising CVD-TiN (100 Angstroms) on TEOS oxide (squares).

As shown in FIG. 2, the pulsed nucleation layers produced by the methods described herein are substantially less rough and have a smaller grain size, as measure by atomic force microscopy, than tungsten films produced by conventional CVD.

Subsequent Process Steps

Figure 3:
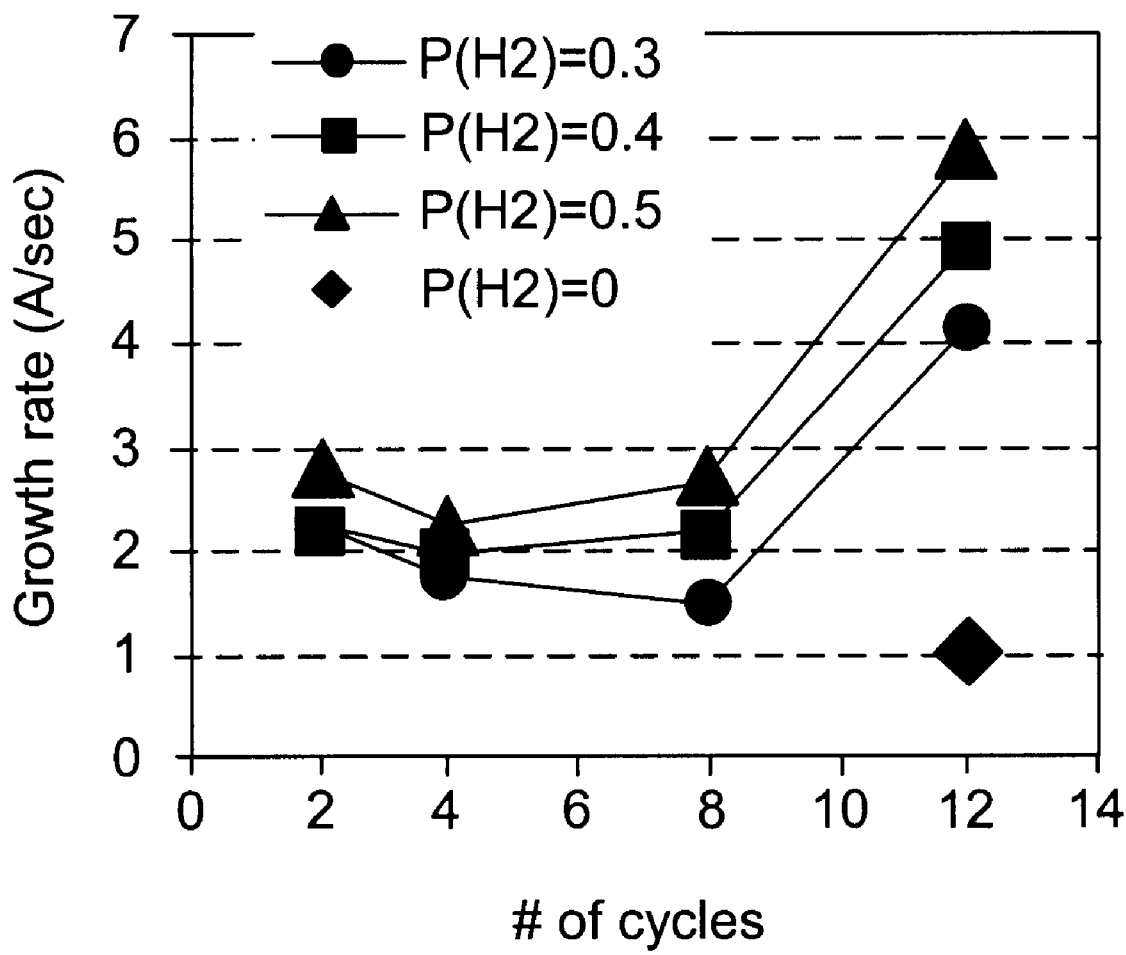
FIG. 3 depicts the relationship between growth or deposition rate (in Angstroms/second) and number of cycles for an embodiment of the invention wherein continuous hydrogen delivery, at various pressures, is used in connection with the pulsed nucleation.

According to aspect of the invention, the pulsed nucleation cycle described above can be repeated until a near-continuous, e.g., >50%, nucleation layer is formed. Subsequent cycles optionally are performed with continuous hydrogen gas flow in connection with the alternating pulses of reducing and tungsten-containing gases. Preferably, about four to ten cycles of the pulsed nucleation are performed prior to the use of hydrogen with the tungsten-containing gases. As shown in FIG. 3, the use of continuous hydrogen results in an increase in growth rate and thus, a reduction of the number of cycles required to form the nucleation layer. A representative tungsten nucleation layer of 100 Angstroms thickness with step coverage of 96% in contacts with an aspect ratio of 12:1 can be produced as follows:

$SiH_4$ 200 sccm for 2 seconds
$WF_6$ 600 sccm for 2 seconds
Hydrogen 7000 sccm
Argon 7000 sccm
Preheat 30 seconds
5 cycles, 42 seconds at 350° C.

According to another aspect of the invention, the purging step between the alternating tungsten and reducing agent dosing is performed by introducing hydrogen or nitrogen gas into the deposition chamber.

According to another aspect of the invention, the pulsed nucleation process is followed by more conventional bulk processing using $H_2$ and/or $SiH_4$ with $WF_6$ (or another tungsten-containing gas) in a CVD process. Thus, the methods of the invention can further comprise the step of depositing tungsten film by CVD atop the nucleation layer by contacting the nucleation layer with $SiH_4$ and/or $H_2$ simultaneously with $WF_6$ under suitable conditions to deposit a tungsten film.

Furthermore, a soak step could be implemented subsequent to the pulsed nucleation process and prior to the CVD process as described above. The soak step can comprise of substrate exposure to gases such as $N_2$, $H_2$, $O_2$, $Si_2H_6$, $B_2H_6$, or a combination thereof in a gaseous or plasma state.

If a multi-station reactor that enables parallel processing of multiple wafers is used, the alternating reactant deposition process may occur on some stations, simultaneous $WF_6$—$SiH_4$ CVD on other stations after completion of alternating deposition process, and then simultaneous $WF_6$—$H_2$ CVD on the final deposition stations for complete tungsten fill.

More specifically, wafers that had been subjected to the pulsed alternating deposition methods described herein at the first 1, 2, 3, or more stations of the multi-station deposition system are then moved to a station wherein tungsten is deposited by the reaction of $WF_6$ and $H_2$. The $WF_6$ and $H_2$ gases are simultaneously introduced to achieve excellent gap-fill by chemical vapor deposition at higher rates. In addition, inert gases can also be flowed to the deposition stations. . When such a multi-station system is used, the deposition temperatures can be independently optimized for the alternating-process deposition described herein or for subsequent steps involving $WF_6$-$SiH_4$ CVD and/or $WF_6$—$H_2$ CVD. This process can be formed on some but not all of the pedestals of the multi-station system with hydrogen and $WF_6$ gases flowing simultaneously onto the other pedestals.

As one of skill will appreciate, this process can be performed with continuous hydrogen and/or nitrogen flow during both dosing and purging As one of skill may appreciate, it may be advantageous to have an additional $SiH_4$ dose step after the final dosing with the tungsten-containing gases to protect subsequent layers from residual tungsten residue in the chamber.

According to another aspect of the invention, the pulsed nucleation layers of the invention can serve as a seed layer for subsequent deposition of Cu or other metals. Likewise, formation of the pulsed nucleation layer can be followed by preparation of a barrier layer. For example, the methods of the invention can further comprise the step of depositing a tungsten barrier film by CVD atop the nucleation layer by contacting the nucleation layer with diborane, and optionally silane, simultaneously with $WF_6$ under suitable conditions to deposit the tungsten film.

Further, it will be recognized by those skilled in the art that a variety of techniques of forming interconnect, such as the single or dual damascene technique, or other traditional techniques of forming low resistance contacts or plugs which involve filling an opening with conductive materials such as tungsten or aluminum may be used to practice the present invention. Moreover, it should be understood that the present invention is applicable to forming a seed layer in a contact and/or a via atop a conductive or a doped region formed on a semiconductor substrate.

Deposition Chamber

The methods of the invention may be carried out in a Novellus Altus CVD chamber, the Concept 2 Altus chamber, the Concept 3 Altus processing chamber, or any of a variety of other commercially available CVD tools. More specifically, the process can be performed on multiple deposition stations in parallel. See, e.g., U.S. Pat. No. 6,143,082, which is incorporated herein by reference for all purposes. In some embodiments of the present invention, the pulsed nucleation process is performed at a first station that is one of five or more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface. After nucleation of the tungsten film is complete, the gases are turned off. The semiconductor substrate, having a first thickness of tungsten deposited at a first rate, is then moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of W nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten containing gas. These stations also can provide for the simultaneous delivery of inert gases with the dedicated gases. Thus, tungsten is deposited by moving wafers from station to station such that the wafer is sequentially exposed to the reducing gases and then the tungsten-containing gases until the desired thickness of tungsten is obtained.

Another aspect of the invention provides for a module for alternating deposition of tungsten containing one or more of the following design elements:

a plurality of deposition stations comprising a showerhead or dispersion plate for uniform gas introduction paired with a heated pedestal that holds a wafer underneath the showerhead;

a plurality of deposition stations with showerheads flush-mounted with the top of the module vacuum chamber to minimize gas re-circulation in the module and promote efficient purging between alternating deposition steps;

a fully purged top plate of the module vacuum chamber consisting of a purge gas plenum covering the top plate area not occupied by deposition showerheads wherein improved station-to-station isolation and reduced purge times between deposition cycles are obtained; or a vacuum chamber in which the heated pedestals from each deposition station are completely or partially isolated from each other by an annular pumping ring connected to the chamber exhaust. This feature further enhances station-to-station isolation and enables different processes to be run simultaneously on alternate stations in the same module.

The module may further comprise means, provided to each showerhead, for creating a RF plasma in between the showerheads and the substrate platens. Preferably, such means comprise an RF energy source, a match network, and the necessary electrical connections. In another embodiment, the module may further comprise means for creating a microwave plasma in the chamber.

Figure 5:
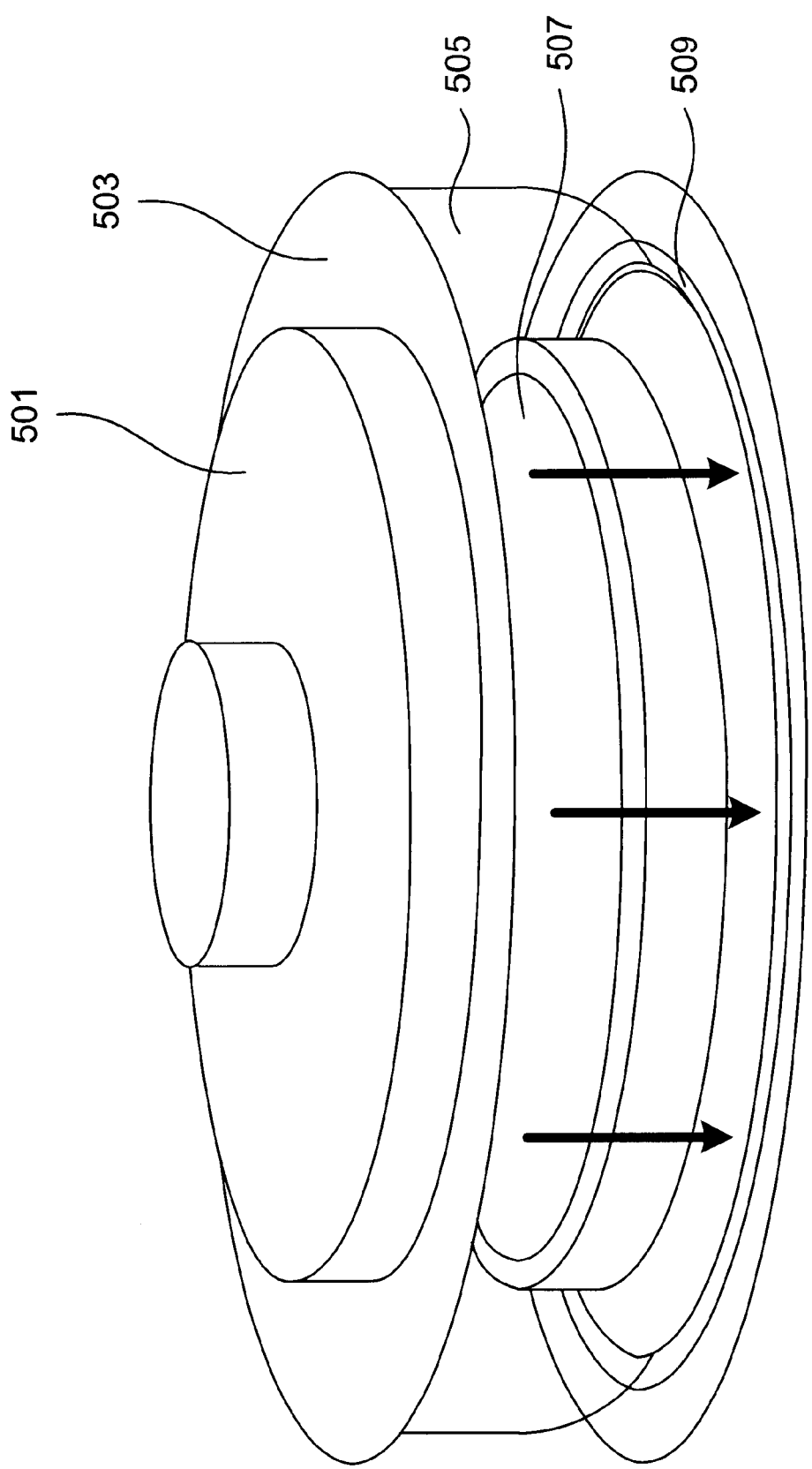
FIG. 5 shows a schematic representation of a deposition station module having a flush-mounted showerhead 501, a fully purged top plate 503, and an annular pumping port 509. Wafer 507 is surrounded by an inert gas curtain 505.

A representative example of such a module having a flush-mounted showerhead, a fully purged top plate, and an annular pumping port is shown in FIG. 5.

As will be appreciated in the art, each such deposition station will typically have a heated substrate platen for holding and heating a substrate to a predetermined temperature. In addition, each typically will have a backside gas distribution system to prevent deposition of the W film on the backside of the substrate, and a vacuum clamping manifold for clamping the substrate to the platen. Finally, the deposition chamber can be equipped with a transport system for transporting wafers or substrates into and out of the chamber as well as between deposition stations.

Figure 4:
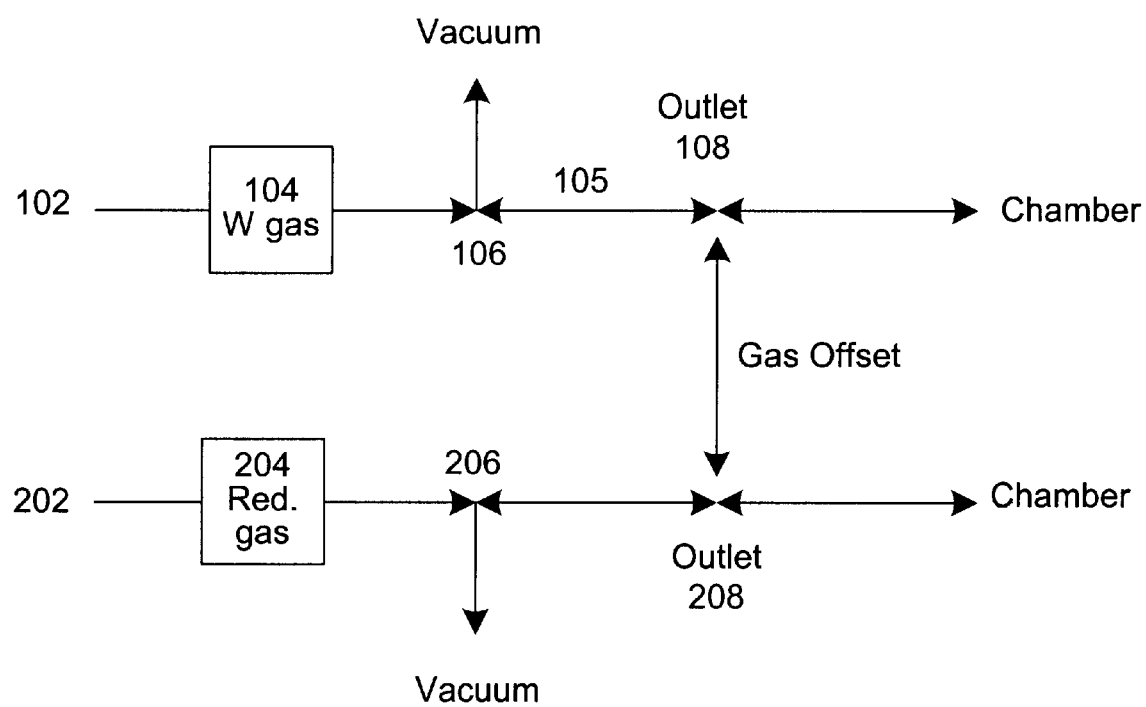
FIG. 4 shows a schematic representation of an embodiment of the dual divert gas box.

The invention also provides for a gas manifold system which may be used to provide line charges to the various gas distribution lines as shown schematically in FIG. 4. Manifold 104 has an input 102 from a source of the tungsten-containing gas (not shown), and manifold 204 has an input 202 from a source of the reducing gas (not shown). The manifolds, 104 and 204, provide the tungsten-containing gas and reducing gases to the deposition chamber through valved distribution lines, 105 and 205, respectively. The various valves are opened or closed to provide a line charge, i.e., to pressurize the distribution lines. More specifically, to pressurize distribution line 105, valve 106 is closed to vacuum and valves 108 is closed. After a suitable increment of time, valve 108 is opened (valve 208 is closed) and the tungsten-containing gas is delivered to the chamber. Again, after a suitable time for delivery of the gas, valve 108 is closed. The chamber can then be purged to a vacuum by opening of valves 106 to vacuum.

A similar process is used to deliver the reducing gas. For example, the line is charged by closing valve 208 and closing valve 206 to vacuum. Opening of valve 208 allows for delivery of the reducing gas to the chamber. It has been found that the amount of time allowed for line charges changes the amount and timing of the initial delivery of the gas.

FIG. 4 also shows vacuum pumps wherein valves 106 and 206, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety.

What is claimed is:

1. A method of forming a tungsten layer on a surface of a semiconductor substrate comprising the steps of:
   (a) positioning said semiconductor substrate at a deposition station within a deposition chamber;
   (b) heating said semiconductor substrate to a temperature between approximately 250 to 475° C. at said deposition station;
   (c) flowing a reducing gas into said deposition chamber whereby said reducing gas is adsorbed onto said surface of said substrate;
   (d) purging the reducing gas from the-deposition chamber;
   (e) flowing a tungsten-containing gas into said deposition chamber, whereby said deposited reducing gas is substantially reduced to a tungsten film;
   (f) purging the tungsten-containing gas from the deposition chamber; and
   (g) repeating (c) through (f) for one or more additional cycles,
   wherein the pressure of the deposition chamber is maintained at more than about 1 Torr.

2. The method of claim 1, further comprising, prior to flowing the reducing gas, performing an initiation soak step, which consists of exposure of the substrate to a gas in a gaseous or plasma state for about 2 to about 60 seconds, wherein said initiation soak gas comprises $SiH_4$, $B_2H_6$, $Si_2H_6$, $H_2$, Ar, $N_2$, or $O_2$, or a combination thereof.

3. The method of claim 2, wherein said initiation soak gas is in a plasma state which is produced by either an radio frequency or microwave energy source.

4. The method of claim 1, wherein said reducing gas comprises $SiH_4$, $Si_2H_6$, $H_2$, $B_2H_6$, $SiH_2Cl_2$ or a combination thereof.

5. The method of claim 1, wherein said tungsten-containing gas comprises $WF_6$, $WCl_6$, or $W(CO)_6$.

6. The method of claim 1, wherein said reducing gas further comprises argon, hydrogen, nitrogen, or a combination thereof.

7. The method of claim 1, wherein said tungsten-containing gas further comprises argon, hydrogen, nitrogen, or a combination thereof.

8. The method of claim 1, wherein (c) through (f) are repeated until the desired thickness of said tungsten nucleation layer is obtained.

9. The method of claim 1, wherein (f) comprises introducing a purge gas at a fixed pressure.

10. The method of claim 9, wherein said purge gas is hydrogen, nitrogen, an inert gas, or a mixture thereof.

11. The method of claim 1, wherein (f) comprises evacuating gases from the chamber.

12. The method of claim 1, further comprising:
    treating said substrate with $SiH_4$, $Si_2H_6$, $B_2H_6$, $N_2$, $O_2$, $H_2$, an inert gas, or a combination thereof in a gaseous or plasma state.

13. The method of claim 1, wherein said deposition chamber has a single station.

14. The method of claim 1, wherein said deposition chamber has multiple stations.

15. The method of claim 14, further comprising:
    repositioning said semiconductor substrate to a second deposition station;
    providing a second reducing gas to said surface; and
    providing a second tungsten-containing gas to said surface to provide a second tungsten film, wherein said second tungsten film is at least about one monolayer thick.

16. The method of claim 14, wherein one or more stations is used for pulsed nucleation to form the seed layer and the remainder of the stations are used for CVD plugfill.

17. The method of claim 16, further comprising:
    repositioning said semiconductor substrate to a second deposition station, wherein said substrate has a nucleation layer of the desired thickness; and
    contacting the substrate with a $WF_6$ and a reducing gas under CVD conditions.

18. The method of claim 14, wherein the substrate is preheated at a first station and then repositioned to a second station for an initiation soak step, which comprises exposure of the substrate to a gas in a gaseous or plasma state for about 2 to about 60 seconds.

19. The method of claim 14, wherein after an initiation soak step, the substrate is repositioned to a second deposition station, wherein the initiation soak step comprises exposure of the substrate to a gas in a gaseous or plasma state for about 2 to about 60 seconds.

20. The method of claim 1, further comprising performing an initiation soak step comprising exposure of the semiconductor substrate to diborane.

21. A method of forming a tungsten layer on a surface of a semiconductor substrate, the method comprising:
    (a) positioning said semiconductor substrate at a deposition station within a deposition chamber comprising a plurality of deposition stations and allowing parallel processing of multiple wafers;
    (b) flowing a reducing gas onto one or more of the deposition stations within said deposition chamber whereby said reducing gas is adsorbed onto said surface of said substrate;
    (c) purging the reducing gas from the deposition chamber;
    (d) flowing a tungsten-containing gas onto the one or more deposition stations of (b) such that it reacts with the reducing agent adsorbed on the surface of the substrate to form a tungsten film;
    (e) purging the tungsten-containing gas from the deposition chamber;
    (f) repeating (b) through (e) for any number of cycles until a desired thickness of tungsten has been deposited; and
    (g) concurrently contacting the substrate with a tungsten-containing gas, which may be the same or different from that used in (d), and a reducing gas, which may be the same or different from that used in (b), to deposit a tungsten film by chemical vapor deposition.

22. The method of claim 21, wherein the pressure of the deposition chamber is maintained at more than about 1 Torr.

23. The method of claim 21, further comprising, after (b) and before (d), repositioning said semiconductor substrate to a second deposition station.

24. The method of claim 21, wherein one or more of the plurality of deposition stations are used for pulsed deposition of tungsten and the remainder of the deposition stations are used to deposit tungsten by chemical vapor deposition.

25. The method of claim 21, further comprising repositioning said semiconductor substrate to a second deposition station after (f) and prior to (g).

26. The method of claim 21, wherein a first set of deposition stations is dedicated to delivering reducing gases and a second set of deposition stations is dedicated to delivering tungsten containing gases.

27. The method of claim 26, wherein tungsten is deposited by moving the semiconductor substrate between a first station and a second station, whereby the semiconductor substrate is sequentially exposed to the reducing gases and then the tungsten containing gases until a desired thickness of tungsten is deposited.

28. The method of claim 21, wherein at least one of the plurality of deposition stations comprises a showerhead or dispersion plate for uniform gas introduction paired with a heated pedestal for holding the semiconductor underneath the showerhead.

29. The method of claim 28, wherein the showerhead is flush-mounted with the top of the deposition chamber to thereby minimize gas re-circulation in the chamber and promote efficient purging between alternating deposition steps.

30. The method of claim 29, further comprising a purge gas plenum in the top of the deposition chamber in an area not occupied by showerheads.

31. The method of claim 21, wherein at least one some of the deposition stations comprise (i) a pedestal for holding the semiconductor substrate and (ii) an annular pumping ring connected to a chamber exhaust to thereby enhance station-to-station isolation.

32. The method of claim 21, further comprising performing an initiation step comprising exposure of the semiconductor substrate to diborane to precondition the substrate surface.

33. The method of claim 21, wherein said reducing gas comprises $SiH_4$, $Si_2H_6$, $H_2$, $B_2H_6$, $SiH_2Cl_2$ or a combination thereof.

34. The method of claim 21, wherein said tungsten-containing gas comprises $WF_6$, $WCl_6$, or $W(CO)_6$.

35. The method of claim 21, wherein said reducing gas further comprises argon, hydrogen, nitrogen, or a combination thereof.

36. The method of claim 21, wherein said tungsten-containing gas further comprises argon, hydrogen, nitrogen, or a combination thereof.

37. The method of claim 21, wherein at least one of (c) and (e) comprise introducing a purge gas to the deposition chamber.

38. The method of claim 36, wherein said purge gas is comprised of hydrogen, nitrogen, an inert gas, or a mixture thereof.

39. The method of claim 21, wherein at least two of steps (b), (d), and (g) are performed in different deposition stations of the deposition chamber.

* * * * *